(12) United States Patent
von Malm

(10) Patent No.: US 7,922,358 B2
(45) Date of Patent: Apr. 12, 2011

(54) ILLUMINATION DEVICE, LUMINAIRE AND DISPLAY DEVICE

(75) Inventor: Norwin von Malm, Thumhausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 145 days.

(21) Appl. No.: 12/240,392

(22) Filed: Sep. 29, 2008

(65) Prior Publication Data
US 2009/0097234 A1    Apr. 16, 2009

(30) Foreign Application Priority Data

Sep. 28, 2007  (DE) .................. 10 2007 046 723
Nov. 13, 2007  (DE) .................. 10 2007 054 037

(51) Int. Cl.
*F21V 9/00*   (2006.01)

(52) U.S. Cl. .......................... 362/293; 362/84
(58) Field of Classification Search .................. 362/293, 362/84, 298, 103–108; 359/308, 529
See application file for complete search history.

(56) References Cited

U.S. PATENT DOCUMENTS

| | | | | |
|---|---|---|---|---|
| 6,006,404 | A * | 12/1999 | Sun .............. | 24/114.9 |
| 6,511,198 | B1 * | 1/2003 | Erickson ............ | 362/103 |
| 6,650,045 | B1 | 11/2003 | Forrest et al. | |
| 6,965,197 | B2 | 11/2005 | Tyan et al. | |
| 7,358,663 | B2 * | 4/2008 | Chen .............. | 313/504 |
| 2001/0040717 | A1 * | 11/2001 | Minoura et al. ........ | 359/263 |
| 2005/0036327 | A1 * | 2/2005 | Patel ............... | 362/487 |
| 2005/0079324 | A1 * | 4/2005 | Haunschild et al. ....... | 428/143 |
| 2006/0232992 | A1 * | 10/2006 | Bertram et al. ......... | 362/555 |
| 2007/0085476 | A1 * | 4/2007 | Hirakata et al. ........ | 313/506 |
| 2007/0145889 | A1 * | 6/2007 | Tamura et al. ......... | 313/504 |
| 2007/0230211 | A1 * | 10/2007 | Osato et al. .......... | 362/600 |

FOREIGN PATENT DOCUMENTS

| | | |
|---|---|---|
| DE | 19837224 | 3/2000 |
| DE | 10032377 | 1/2002 |
| DE | 20207799 | 9/2002 |
| DE | 20121716 | 6/2003 |
| DE | 10 231325 | 2/2004 |
| DE | 10255933 | 6/2004 |
| DE | 10 312219 | 10/2004 |
| DE | 10353992 | 6/2005 |

(Continued)

*Primary Examiner* — Evan Dzierzynski
(74) *Attorney, Agent, or Firm* — Cohen Pontani Lieberman & Pavane LLP

(57) ABSTRACT

An illumination device (1, 1A, 1B) is disclosed. The illumination device (1, 1A, 1B) contains an organic light-emitting component (2, 2A, 2B, 2C, 2C') containing a functional layer sequence (23, 23A) for generating light, a light passage area (7, 7A, 7B), which is provided for coupling out light emitted by the organic light-emitting component (2, 2A, 2B, 2C, 2C') from the illumination device (1, 1A, 1B) and for coupling ambient light into the illumination device (1, 1A, 1B) a retroreflector (5, 5A, 5B), which is provided for reflecting at least part of the ambient light coupled in through the light passage area (7, 7A, 7B) back to the light passage area (7, 7A, 7B). The organic light-emitting component (2, 2A, 2B, 2C, 2C') is embodied such that it is at least partly light-transmissive. The functional layer sequence (23, 23A) of the organic light-emitting component (2, 2A, 2B, 2C, 2C') is arranged between the light passage area (7, 7A, 7B) and the retroreflector (5, 5A, 5B). A luminaire (10) and a display device (100) are also disclosed.

18 Claims, 7 Drawing Sheets

FOREIGN PATENT DOCUMENTS

| | | |
|---|---|---|
| DE | 69732713 | 4/2006 |
| DE | 60301466 | 6/2006 |
| DE | 202006010269 | 10/2006 |
| DE | 202006012661 | 11/2006 |
| DE | 102005040558 | 3/2007 |
| DE | 102005061036 | 6/2007 |
| WO | WO 2004/084259 | 9/2004 |
| WO | WO 2007/022741 | 3/2007 |

* cited by examiner

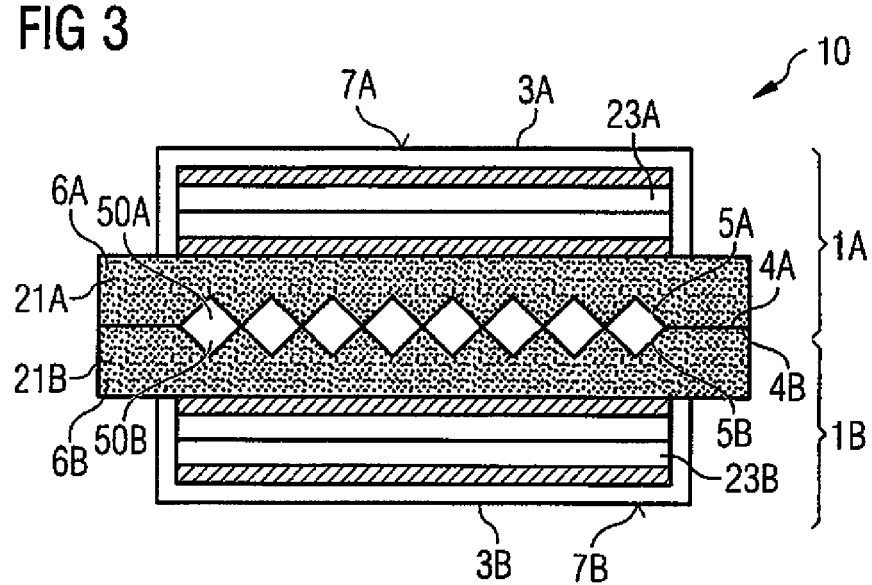
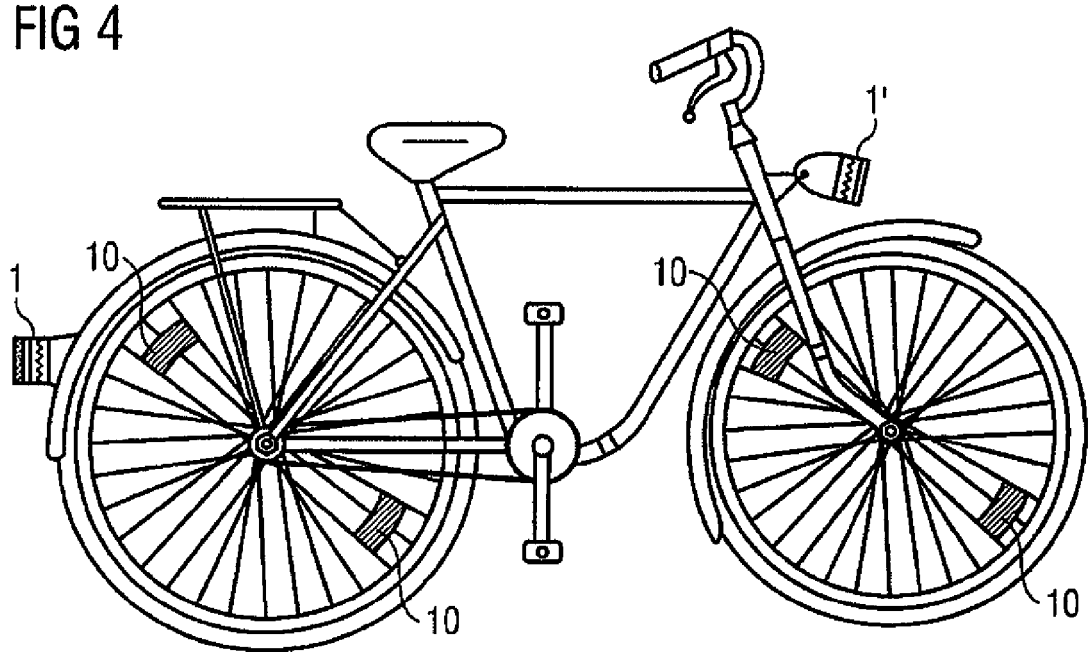

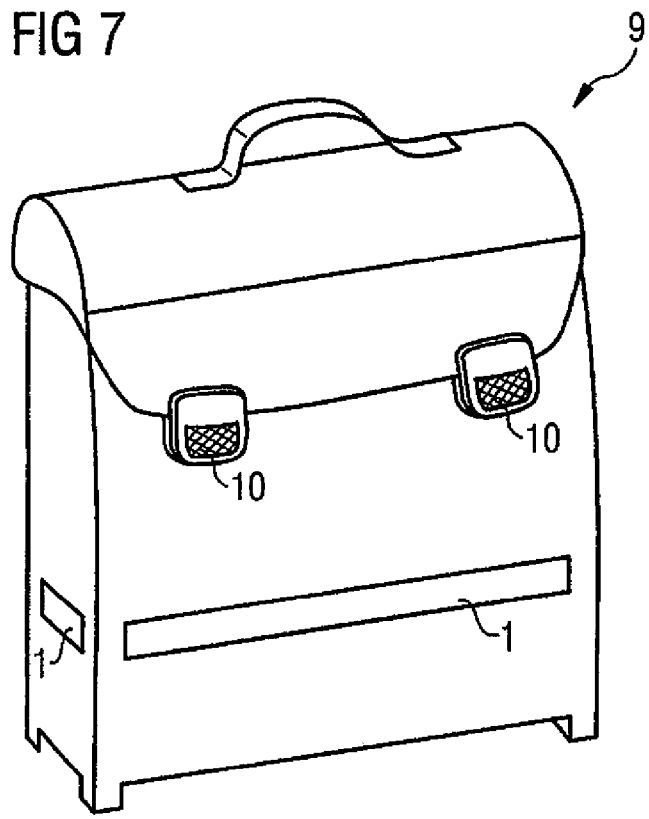
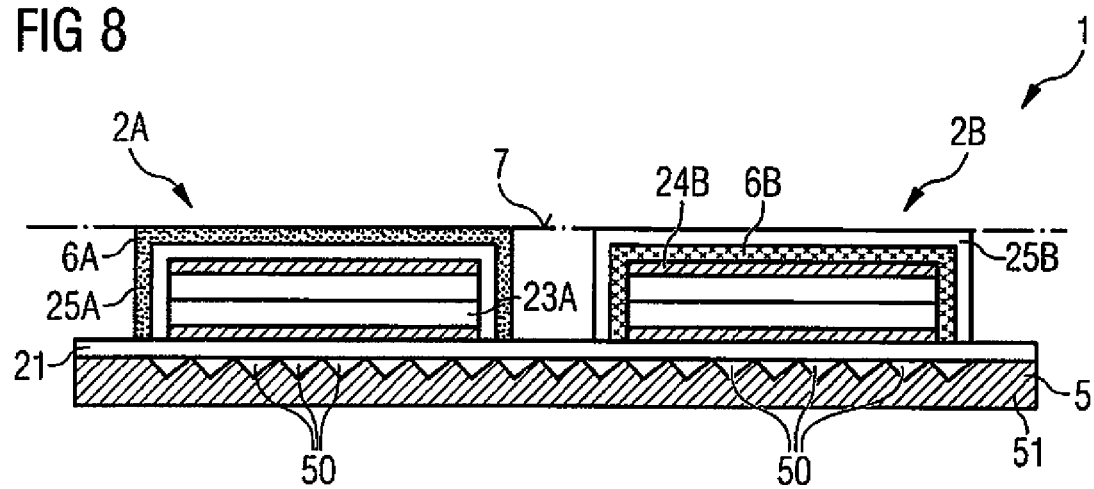

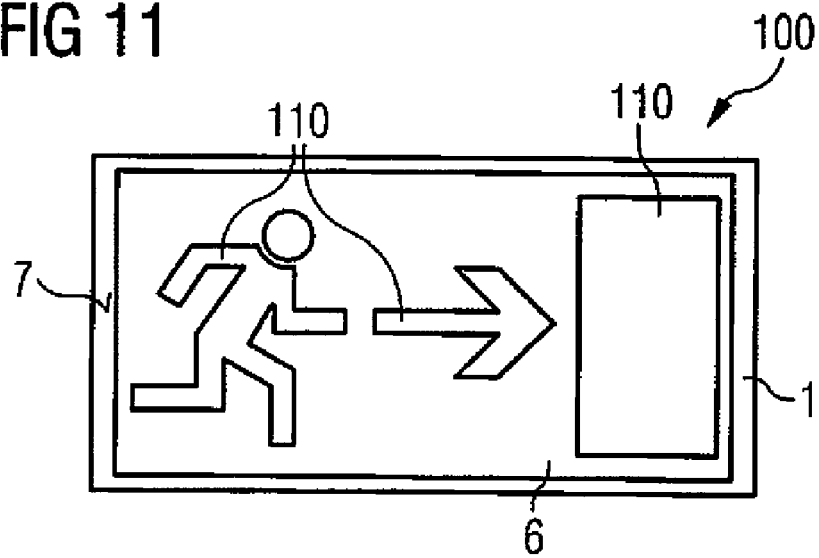
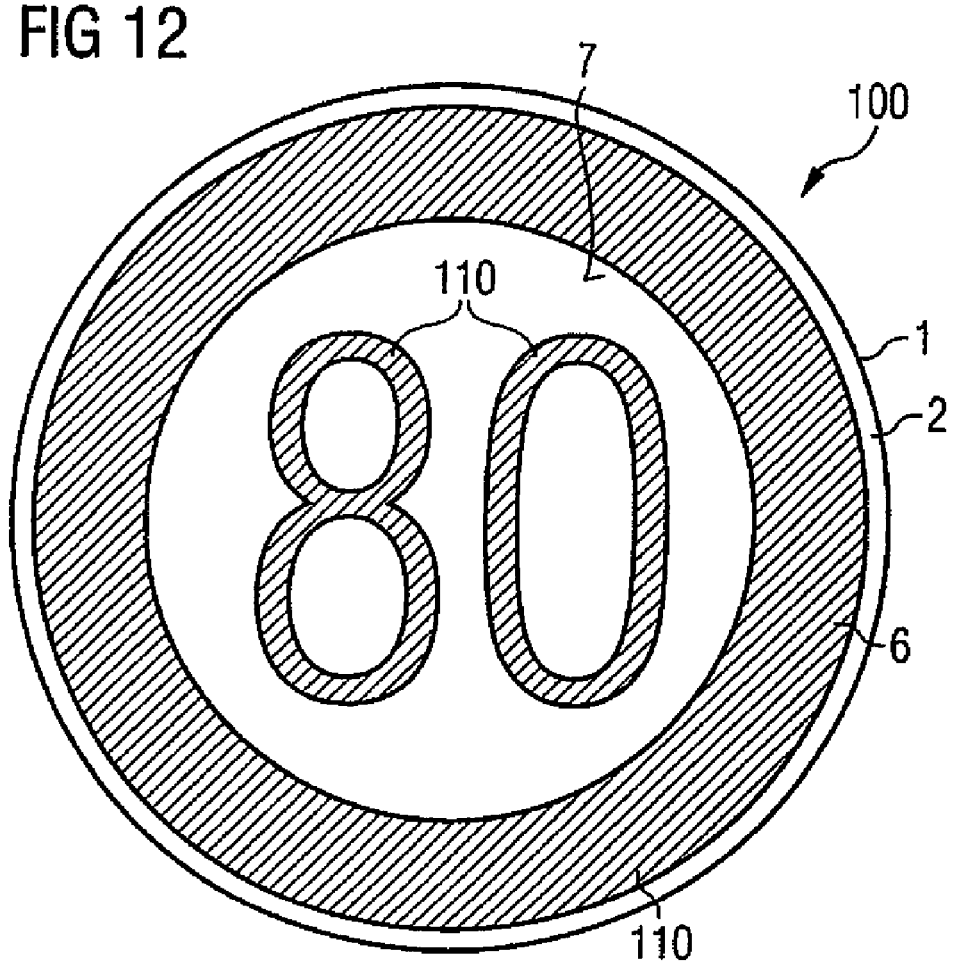

ILLUMINATION DEVICE, LUMINAIRE AND DISPLAY DEVICE

RELATED APPLICATIONS

This patent application claims the priorities of German Patent Applications 10 2007 046723.2 filed Sep. 28, 2007 and 10 2007 054037.1 filed Nov. 13, 2007 the disclosure content of both of which is hereby incorporated by reference.

FIELD OF THE INVENTION

The present application relates to an illumination device, a luminaire and a display device.

BACKGROUND OF THE INVENTION

A multiplicity of different illumination devices comprising different luminous means are known. Examples of luminous means are incandescent lamps, fluorescent tubes and light-emitting diodes.

SUMMARY OF THE INVENTION

It is an object of the present application to provide an illumination device which has good visibility when not in operation.

An illumination device in accordance with an embodiment of the invention has an organic light-emitting component. Furthermore, it has a light passage area, which is provided for coupling out light emitted by the organic light-emitting component from the illumination device and for coupling ambient light into the illumination device.

Moreover, the illumination device has a retroreflector, which is provided for reflecting at least part of the ambient light coupled in through the light passage area back to the light passage area. At least part of the ambient light reflected by the retroreflector is advantageously coupled out from the illumination device through the light passage area.

In the present context, "ambient light" is understood to mean visible electromagnetic radiation which is generated by an external light source outside the illumination device. By way of example, a headlight, for instance a vehicle headlight, street or interior lighting and/or the sun are appropriate as external light source.

The retroreflector reflects ambient light incident on the retroreflector from the light passage area, for a large range of angles of incidence, substantially back in the same direction from which it comes. To put it another way, a part of a light beam that is incident on the retroreflector and a part of the light beam that is reflected by the retroreflector run substantially parallel. In this case, the angle of incidence is the angle between the incident part of the light beam and the normal to the area of a main extension plane of the retroreflector. In particular, the incident part and the reflected part form an angle of less than or equal to 15°, preferably of less than or equal to 10°, particularly preferably of less than or equal to 5°. An upper limit for the angle of incidence is for example greater than or equal to 45° preferably greater than or equal to 60°, particularly preferably greater than or equal to 75°.

In one development, the retroreflector has a slight scattering. To put it another way, the incident part of the light beam is reflected back into a narrow, divergent beam cone. The beam cone has a centre axis which runs substantially parallel to the incident part of the light beam, that is to say forms with the latter for example an angle of less than or equal to 15°, preferably of less than or equal to 10° and particularly preferably of less than or equal to 5°. An aperture angle of the beam cone is preferably less than or equal to 15°, particularly preferably less than or equal to 10°, and in particular greater than or equal to 0.5°, preferably greater than or equal to 2°. In this case, the aperture angle is the angle between the centre axis and an envelope surface of the beam cone. The envelope surface is in particular the set of all points whose distance from the center axis is chosen such that the intensity of the radiation has fallen to 1/e of the intensity on the center axis.

The retroreflection into a narrow, divergent beam cone is advantageous, for example, if the light beam incident from an external light source—such as a headlight of a vehicle—is not intended to be reflected back directly into the external light source, but rather is intended to be perceived for example by an observer in the vicinity of the external light source—for instance the vehicle driver.

The organic light-emitting component is at least partly light-transmissive. It is preferably transparent. The organic light-emitting component or at least the functional layer sequence thereof is arranged between the light passage area and the retroreflector. In other words in the direction from a rear side to a front side of the illumination device, the retroreflector, the functional layer sequence and the light passage area succeed one another in this order. In this way, in particular at least part of the ambient light coupled into the illumination device through the light passage area is guided through the organic light-emitting component or at least through the functional layer sequence and impinges on the retroreflector. Advantageously, therefore, in particular also at least part of the ambient light that is reflected by the retroreflector and coupled out from the illumination device through the light passage area passes through the light-transmissive organic light-emitting component.

By means of the retroreflector, ambient light that impinges on the light passage area at a predetermined entrance angle, is coupled into the illumination device and reflected back to the light passage area by the retroreflector is coupled out from the illumination device at an exit angle with respect to the light passage area, said exit angle having substantially the same value as the entrance angle. In this case, the entrance or exit angle is the angle with respect to a normal to the area of the light passage area. By way of example, an upper limit for the entrance angle has a value of greater than or equal to 45°, preferably of greater than or equal to 60°, particularly preferably of greater than or equal to 75°.

By means of the ambient light reflected back from the retroreflector to the light passage area, a good visibility of the illumination device is obtained even when not in operation, for example when the organic light-emitting component is switched off, and/or in the case of a functional impairment such as a defect of the organic light-emitting component. In the case of inadequate ambient light, a good visibility of the illumination device can be obtained by means of the organic light-emitting component.

The organic light-emitting component has a functional layer sequence. The functional layer sequence is light-transmissive, preferably transparent or semitransparent. At least one layer of the functional layer sequence contains an organic material. By way of example, the organic material is a polymer and/or a small molecule material. The organic material is provided, in particular, for emitting electromagnetic radiation. The organic light-emitting component constitutes in particular an organic light-emitting diode (OLED). At least part of the electromagnetic radiation emitted by the functional layer sequence during operation in the direction of the retroreflector is advantageously reflected back from the latter in the direction of the light passage area and coupled out from the illumination device through said light passage area.

The functional layer sequence is arranged between two electrodes which—like the functional layer sequence itself—are embodied such that they are at least partly light-transmissive and are preferably embodied such that they are transparent or semitransparent. Appropriate electrodes include metal films, for example, the thickness of which is chosen to be so small that they transmit at least part of the light emitted by the functional layer sequence. As an alternative or in addition, a transparent conducting oxide (TCO) such as indium tin oxide (ITO) can be used for one or both electrodes. The functional layer stack with the electrodes is expediently arranged on a light-transmissive substrate, in particular a transparent substrate. The substrate can comprise for example a glass plate, a glass sheet or a polymer film or consist of at least one of these elements.

In one configuration, the retroreflector is embodied in wavelength-selective fashion. By way of example, it contains a color filter layer. The color filter layer transmits a first spectral subrange of the visible electromagnetic spectrum and absorbs a further spectral subrange of the visible electromagnetic spectrum. As an alternative to a color filter layer, the retroreflector can contain a wavelength-selective mirror layer for reflecting the ambient light which mirror layer reflects the first subrange and absorbs and/or transmits the second subrange.

Preferably, the first spectral subrange partly or completely overlaps the spectral distribution of the light emitted by the organic light-emitting component during operation of the illumination device. In one configuration, an intensity maximum of the light emitted by the organic light-emitting component has a wavelength lying in the first spectral subrange of the visible spectrum. By way of example, the retroreflector embodied in wavelength-selective fashion reflects electromagnetic radiation with the wavelength of an emission maximum of the organic light-emitting component.

That portion of the ambient light which is reflected back from the retroreflector to the light passage area and is coupled out from the illumination device advantageously produces substantially the same color impression as the light emitted by the organic light-emitting component. The illumination device advantageously can bring about the same color impression independently of the operating state of the organic light-emitting component.

A color filter layer contained in the retroreflector is arranged in particular between the organic light-emitting component and a side remote from the light passage area, that is to say the rear side, of the illumination device. In another configuration, the illumination device has a color filter layer arranged at least in places between the light passage area and the organic light-emitting component. In a plan view of the light passage area, the color filter layer covers the organic light-emitting component and the retroreflector in places or over the whole area in this configuration. In one development, the color filter layer is embodied with an encapsulation of the organic light-emitting component. By way of example, the encapsulation contains at least one colorant for forming the color filter layer.

In one development wherein the color filter layer is arranged in places between the light passage area and the organic light-emitting component, a first spectral portion of the light emitted by the organic light-emitting component is transmitted by the colour filter layer and a second spectral portion of the light emitted by the organic light-emitting component is absorbed by the color filter layer.

By way of example, the organic light-emitting component emits white light. The color filter layer absorbs a short-wave, second spectral subrange of the visible spectral range; by way of example, it absorbs in the blue and green spectral range, and transmits red light as a first spectral subrange. In this way, the locations of the organic light-emitting component which are not covered by the color filter layer in a plan view of the light passage area appear with the color impression that corresponds to the spectral distribution generated by the organic light-emitting component. The partial regions covered by the color filter layer appear in the color which corresponds to the first spectral subrange transmitted by the color filter layer. The representation of information, for example of a pattern and/or of at least one symbol, is thus advantageously obtained by means of an individual organic light-emitting component. The symbol or the symbols is or are for example one or a plurality of letters, one or a plurality of numerals and/or one or a plurality of pictograms.

In another configuration, a plurality of organic light-emitting components are arranged laterally alongside one another in a plan view of the light passage area. In one development of this configuration, different color filters are assigned to at least two of the organic light-emitting components arranged laterally alongside one another. By way of example, the respective color filter covers the organic light-emitting component to which it is assigned in places or completely in a plan view of the light passage area. In particular, an intensity maximum of the light emitted by the respective organic light-emitting component has a wavelength lying in the first spectral subrange of the color filter layer assigned to the component.

In a further configuration, the illumination device has a plurality of organic light-emitting components whose functional layer sequences overlap laterally. In other words, the organic light-emitting components succeed one another in the direction from the front side to the rear side of the illumination device. To put it another way, the plurality of organic light-emitting components are stacked one on top of another. By way of example, the stack of organic light-emitting components is suitable for emitting white light.

The plurality of organic light-emitting components which are arranged laterally alongside one another and/or the plurality of organic light-emitting components whose functional layer sequences overlap laterally can, in one development, be driven individually or in subgroups. An illumination device whose color impression and/or whose represented information can be varied during operation is obtained in this way.

In one configuration, the retroreflector contains a mirror layer having a plurality of beam shaping elements. The beam shaping elements are preferably arranged in a monolayer. The mirror layer expediently has a surface which is reflective at least in places. By way of example, a main area of the mirror layer that faces towards the light passage area is reflective. The mirror layer has a metallic material, in particular. By way of example, it has a reflective metal film. As an alternative, the reflection at the surface of the mirror layer can also be effected by means of total reflection, in particular at a main face of the mirror layer that is remote from the light passage area. A mirror layer provided for (total) reflection at a main area remote from the light passage area preferably contains an at least partly light-transmissive, in particular transparent or semitransparent, material. Such a mirror layer can be embodied in a manner integrated with the color filter layer.

In one configuration, at least one beam shaping element has or consists of a depression in the surface of the mirror layer. By way of example, the depression has the form of a prism, a cone, a truncated cone or truncated pyramid. It is produced for example by means of an embossing process in the mirror layer. If the mirror layer has a reflective metal film on a carrier, the embossing of the depressions into the carrier preferably takes place before the production of the reflective metal film.

In a further configuration, at least one of the beam shaping elements has or consists of a lens element. The lens element can be for example glass beads, inorganic grains having a high refractive index and/or glass splinters. In one development of the retroreflector, the lens element is arranged in a depression of the mirror layer and in particular projects beyond the opening of the depression.

As an alternative, the retroreflector can have a partly light-transmissive, translucent or transparent carrier layer containing a plurality of beam shaping elements which are embodied such that they are reflective in places. Partly metallized glass beads, for example, are suitable as beam shaping elements embodied such that they are partly reflective. The beam shaping elements are preferably contained in a monolayer in the carrier layer. The reflective locations are expediently remote from the light passage area.

In one configuration, beam shaping elements are embodied in miniaturized fashion. By way of example, their largest length extent is less than or equal to 1 mm, and in one development it is less than or equal to 250 µm, for example less than or equal to 100 µm.

In a further configuration, the illumination device is embodied in flexible fashion. An illumination device embodied in flexible fashion can advantageously be used particularly diversely.

In one configuration, the illumination device is contained in a luminaire or constitutes a luminaire. The luminaire is in particular a luminaire for a means of transport or for street lighting. By way of example, the luminaire is a position luminaire of a vehicle, for instance of a motor vehicle or bicycle. In this configuration—in particular by means of the retroreflector—a reflector—which is provided at the vehicle, for example—is advantageously integrated in the luminaire—which is for example a rear light of a motor vehicle. In this way, the space requirement for luminaire and reflector is advantageously particularly small.

In another configuration, the illumination device is contained in a display device. The display device is provided, in particular, for representing information. The information can be for example at least one symbol, at least one geometrical shape such as a circle, a triangle, a rectangle, etc., and/or at least one graphical information item such as a drawing or a photograph. By way of example, the display device is a display panel, for example a direction indicating sign—for instance in traffic—a warning panel, a road sign or a license plate. The information has particularly good visibility in particular even when the light-emitting component is switched off or defective.

In a further configuration, a garment or an item of luggage is provided with the illumination device and/or the display device. The garment is for example a jacket or a shoe. The item of luggage is for example a school satchel, a rucksack, a bag such as a holdall or sports bag, or a suitcase.

In one advantageous development, the illumination device and/or the display device are/is embodied in flexible fashion, that is to say in particular in pliable and/or shapeable fashion. In another development, a power supply unit is integrated into the garment or item of luggage and supplies power to the illumination device and/or display device during operation.

BRIEF DESCRIPTION OF THE DRAWINGS

FIG. 3 shows a schematic cross section through a luminaire with two illumination devices in accordance with a second variant of the first exemplary embodiment, FIG. 4 shows a schematic side view of a bicycle with a plurality of illumination devices, FIG. 7 shows a schematic illustration of an item of luggage with a plurality of illumination devices, FIG. 8 shows a schematic cross section through an illumination device in accordance with a third exemplary embodiment, FIG. 11 shows a schematic plan view of a display device in accordance with a first exemplary embodiment, FIG. 12 shows a schematic plan view of a display device in accordance with a second exemplary embodiment.

DETAILED DESCRIPTION OF THE DRAWINGS

In the exemplary embodiments and figures, similar or similarly acting constituent parts are provided with the same reference symbols. The figures and the size relationships among the elements illustrated in the figures should not, in principle, be regarded as true to scale. Rather, individual elements such as layers may be illustrated with an exaggerated size, in particular with an exaggerated thickness, for the sake of better representability and/or for the sake of better understanding.

Figure 1A:
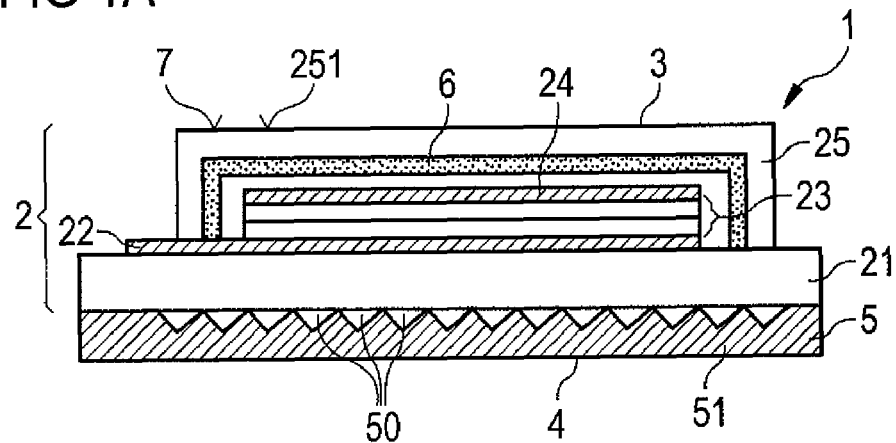
FIG. 1A shows a schematic cross section through an illumination device in accordance with a first exemplary embodiment.

FIG. 1A shows a schematic cross section through an illumination device 1 in accordance with a first exemplary embodiment. The illumination device 1 has an organic light-emitting component 2 containing a substrate 21, to which a first electrode 22 is applied. A functional layer sequence 23 based on an organic material, such as a polymer material and/or small molecules, is applied to the first electrode 22 at the side remote from the substrate 21. A second electrode 24 is arranged on that side of the functional layer sequence 23 which is remote from the first electrode 22. An encapsulation 25, a cap in the present case, protects the functional layer sequence 23 against mechanical damage, soiling and/or moisture. The cap 25 is for example a glass cap, or a plastic cap containing, for example, polycarbonate.

The first and the second electrode are preferably led through the encapsulation 25 into the external space for the purpose of electrically connecting the organic light-emitting component 2. When an operating current is impressed into the functional layer sequence 23 by means of the first and the second electrode 22, 24, an active zone of the functional layer sequence 23 is excited to emit electromagnetic radiation.

The illumination device is provided for emission of electromagnetic radiation from a front side 3. In the present exemplary embodiment, the front side 3 is that side of the organic light-emitting component 2 which is remote from the substrate 21. At the front side 3, the illumination device 1 has a light passage area 7. In the present case, a main area 251 of the encapsulation 25 that is remote from the functional layer stack 23 constitutes the light passage area.

At the rear side 4 opposite to the front side 3, the illumination device 1 has a retroreflector 5. In the first exemplary embodiment, the retroreflector 5 has a metal plate as mirror layer, whose main area facing the front side 3 is provided with beam shaping elements 50 at least in the region covered by the organic light-emitting component 2. The beam shaping elements 50 are in the present case pyramidal depressions embossed into the reflective metal plate 51. By means of the depressions 50, the retroreflector 5 reflects ambient light that impinges on the retroreflector 5 from the light passage area 7 back substantially in that direction from which it impinges on the retroreflector 5.

The pyramidal depressions 50 preferably constitute triple mirrors. To put it another way, each depression preferably has precisely three lateral faces. In one development, the three lateral faces in each case form an angle of approximately 90° with respect to one another, for example an angle of between 85° and 95°, the limits being included.

The organic light-emitting component 2 is embodied such that it is at least partly light-transmissive. It is preferably embodied in transparent fashion. In particular, each of the substrate 21, the first and second electrodes 22, 24 and the functional layer stack 23 are at least partly light-transmissive and in particular transparent or semitransparent.

By way of example, the substrate 21 is a glass plate, a glass sheet or a polymer film. Transparent conductive oxides such as ITO and/or semitransparent metal layers are suitable as materials for the first and second electrodes 22, 24. In this way, at least part of the ambient light coupled into the illumination device 1 through the light passage area 7 is guided through the organic light-emitting component 2 and impinges on the retroreflector 5. From the latter it is reflected back—in particular through the organic light-emitting component 2—at least partly to the light passage area 7. In this way, at least part of the ambient light coupled into the illumination device 1 is coupled out from the illumination device 1 again, wherein the entrance and exit angles are substantially identical, that is to say differ in particular by 15° or less, preferably by 10° or less, particularly preferably by 5° or less.

In addition, at least part of the electromagnetic radiation emitted by the functional layer sequence 23 during operation of the illumination device 1 in the direction of the rear side 4 is reflected back by the retroreflector 5 in the direction of the front side 3 and coupled out through the light passage area 7.

A color filter layer 6 is arranged between the light passage area 7 and the functional layer sequence 23. In the present case, the color filter layer 6 is applied to an inner area of the cap 25 that faces the functional layer sequence 23. The color filter layer 6 has a high transmission coefficient for a first spectral subrange of the visible wavelength spectrum and a high absorption coefficient for a second spectral subrange of the visible wavelength spectrum. An intensity maximum of electromagnetic radiation emitted by the functional layer sequence 23 during operation of the illumination device 1 lies within the first spectral subrange transmitted by the color filter layer 6.

Figure 1B:
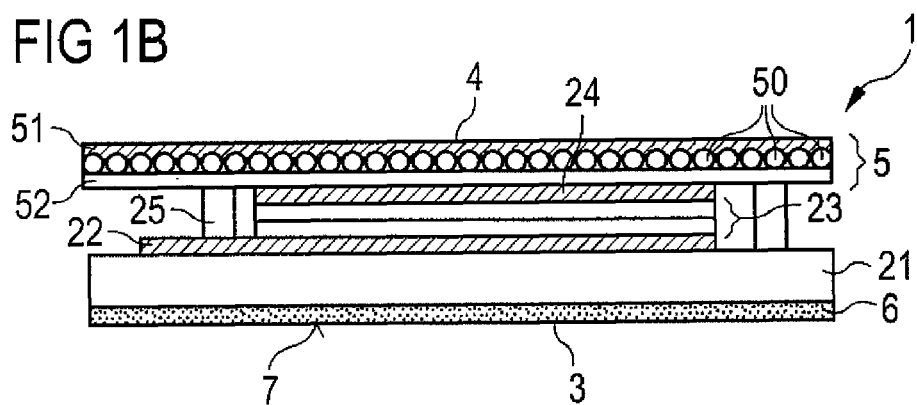
FIG. 1B shows a schematic cross section through an illumination device in accordance with a variant of the first exemplary embodiment.

FIG. 1B illustrates an illumination device 1 in accordance with a variant of the first exemplary embodiment in a schematic cross section.

In contrast to the first exemplary embodiment in accordance with FIG. 1A, in the present case the retroreflector 5 is arranged on the side remote from the substrate 21 of the organic light-emitting component 2. In the present embodiment, in the direction from the rear side 4 to the front side 3 of the illumination device 1, the retroreflector 5, the functional layer sequence 23 and the substrate 21 succeed one another in this order, while in the exemplary embodiment of FIG. 1A, the functional layer sequence 23 succeeds the substrate 21 in the direction from the rear side 4 to the front side 3.

In the variant of the first exemplary embodiment that is illustrated in FIG. 1B, for example the retroreflector 5, in particular together with an encapsulation frame 25, forms the encapsulation or part of the encapsulation of the functional layer sequence 23. The encapsulation frame 25 is for example a spacer ring, for example composed of a plastic or glass material. As an alternative, the encapsulation frame 5 can also be an adhesive bead by means of which the retroreflector 5 is fixed to the substrate 21 of the organic light-emitting component.

The illumination device in accordance with FIG. 1B likewise has a color filter layer 6. The latter is applied in the present case to the main face of the substrate 21 that is remote from the functional layer sequence. As an alternative, the substrate 21 can also constitute the color filter layer 6; by way of example, the substrate 21 contains a colorant for this purpose.

In the variant of the first exemplary embodiment in accordance with FIG. 1B, the retroreflector 5 is a reflector film containing a mirror layer 51, a plurality of lens elements 50 and an at least partly light-transmissive, preferably transparent, covering layer 52. The lens elements are glass beads, for example, which have for example a diameter of less than or equal to 100 µm, in particular of less than or equal to 50 µm. The glass beads 50 are partly embedded into the mirror layer 51, such that the latter has depressions in which the glass beads 50 are arranged, and beyond which the glass beads 50 project. The covering layer 52 protects the beam shaping elements in particular against soiling and/or mechanical damage. In the case of a wavelength-selective retroreflector, the covering layer can constitute a color filter layer and contain a colorant, for example.

Light impinging on the lens element 50 from the front side 3 is refracted upon entering into the lens element 50, reflected at the mirror layer 51 and refracted again on exiting from the lens element 50. The light reflected in this way is reflected back in particular substantially in that direction from which it impinges on the lens element.

Figure 2:
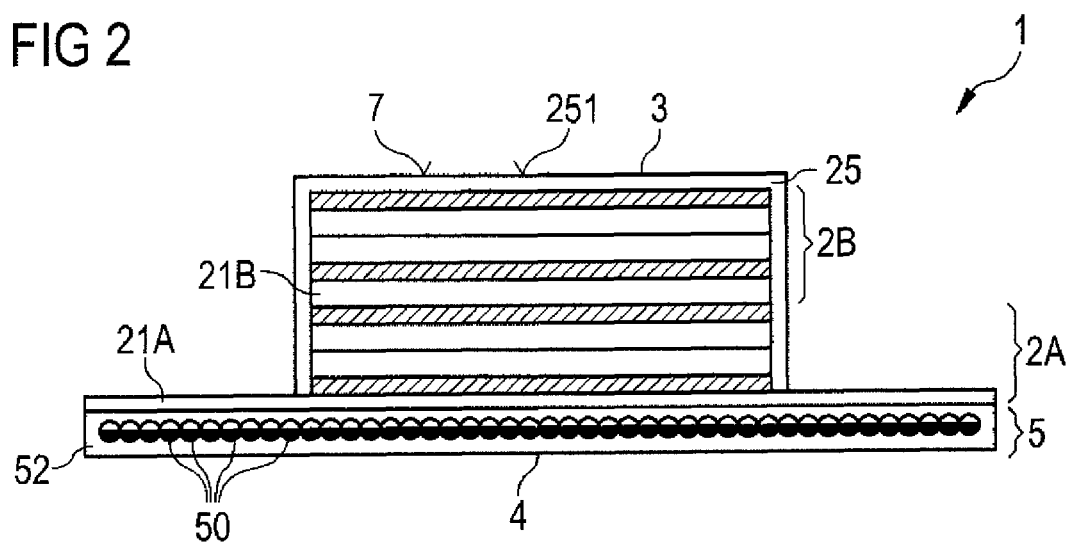
FIG. 2 shows a schematic cross section through an illumination device in accordance with a second exemplary embodiment.

FIG. 2 shows a schematic cross section through an illumination device 1 in accordance with a second exemplary embodiment. The illumination device in accordance with the second exemplary embodiment, in contrast to that of the first exemplary embodiment, has no color filter.

The retroreflector 5 is formed by means of particles composed of an inorganic material. The particles can be glass or glass ceramic particles, for example. The particles have for example polygonal outer faces, for example glass splinters are involved, or they have a rounded shape, for example substantially the shape of a sphere or an ellipsoid. The particles can be solid bodies or hollow bodies. In the present case, the beam shaping elements 50 are glass beads having a diameter of less than or equal to 100 µm, in particular of less than or equal to 50 µm. The surface of the particles is partly mirror-coated in the present case. The mirror-coated part of the surface of the glass beads 50 expediently faces the rear side 4 of the illumination device 1 and is remote from the light passage area 7. As an alternative to particles having a partly mirror-coated surface it is also possible to use non-mirror-coated particles that reflect by means of total reflection.

The beam shaping elements 50 are contained in a monolayer in the retroreflector 5 and embedded in a transparent carrier layer 52, which contains a polymer material, for example. The material of the carrier layer 52 has in particular a refractive index that is lower than the refractive index of the beam shaping elements 50. In one configuration, the refractive index of the beam shaping elements 50 is between 1.5 and 2.5 times as large as the refractive index of the carrier layer 52, the limits being included. In the case of a wavelength-selective retroreflector 5, for example a color filter layer is formed in a manner integrated with the carrier layer 52. By way of example, the carrier layer 52 contains a colorant for this purpose.

A further difference from the first exemplary embodiment is that the illumination device in accordance with FIG. 2 has two organic light-emitting components 2A, 2B that are stacked one above the other in the direction from the rear side 4 to the front side 3. In the present case, the two organic light-emitting components 2A, 2B are arranged in a common encapsulation 25.

The illumination device 1 is embodied in flexible fashion in the present case. The substrates 21A, 21B of the organic light-emitting components 2A, 2B are polymer films, for example. In the present exemplary embodiment, the encapsulation is a transparent thin-film encapsulation 25 having at least one dielectric layer, for example an $SiO_2$ layer, an $Si_3N_4$ layer and/or an oxynitride layer. Preferably, the thin-film encapsulation contains a layer stack composed of alternating dielectric layers and polymer layers. Such a thin-film encapsulation 25 is also suitable for other configurations of the illumination device.

FIG. 3 illustrates a schematic cross section through a luminaire 10 with two illumination devices 1A, 1B in accordance with a second variant of the first exemplary embodiment. The two illumination devices 1A and 1B are arranged in such a way that their rear sides 4A, 4B and in particular their retroreflectors 5A, 5B face one another. The rear sides 4A, 4B of the two illumination devices are preferably fixed to one another. In this way, the front sides 3A, 3B of the illumination devices 1A, 1B lie opposite to one another such that the light passage areas 7A, 7B are remote from one another. Thus, the luminaire 10 illuminates a large solid angle range and/or is suitable for the retroreflection of ambient light from a large solid angle range.

The following features explained on the basis of the first illumination device 1A are also correspondingly applicable to the second illumination device 1B of the luminaire 10.

In the present exemplary embodiment, the retroreflector 5 is embodied in a manner integrated with the substrate 21A of the illumination device 1A. A rear-side main face of the substrate 21A is structured with depressions 50A.

In contrast to the retroreflector 5 of the first exemplary embodiment in accordance with FIG. 1A, the reflection is not actually effected at an area, facing the front side 3, of a reflective mirror layer 51 which contains a light-opaque material. Moreover, in the present case the reflection is effected by means of total reflection at the flanks of the depressions 50A. In the present case, the substrate 21A contains a transparent matrix material and a colorant which is dispersed in the matrix material and which transmits a first spectral subrange of the visible spectrum and absorbs a second spectral subrange of the visible spectrum. In this way, the retroreflector 5A reflects substantially only ambient light having a wavelength within the first spectral subrange back to the light passage area 7A. An intensity maximum of the radiation emitted by the functional layer sequence 23A during operation preferably likewise has a wavelength in the first spectral subrange.

In the present case, the substrate 21A constitutes a color filter layer 6A. As an alternative, the substrate 21A can also contain a colored matrix material for this purpose. If a wavelength selectivity of the retroreflector is not desired, the substrate 21A is expediently embodied in transparent fashion. A retroreflector 5A embodied as in the present exemplary embodiment is also suitable for other configurations of the illumination.

The color filter layer 6A, which is embodied in a manner integrated with the substrate 21A in the present exemplary embodiment, succeeds the functional layer sequence 23A in the direction towards the rear side 4A. This reduces the risk of light emitted by the functional layer sequence 23A in the direction of the front-side light passage area 7A being absorbed by the color filter layer 6A.

FIG. 4 illustrates a bicycle in schematic side view, which bicycle has an illumination device 1 in accordance with the first exemplary embodiment in FIG. 1A as a rear light. By way of example, the light-emitting component 2 of the rear light emits red light and the color filter layer 6 brings about a red color impression.

As an alternative or in addition, the bicycle has a front light 1' containing for example an illumination device in accordance with the second exemplary embodiment in FIG. 2.

By way of example, in the case of the front light 1', a first organic light-emitting component 2A, which emits yellow light, and a second organic light-emitting component 2B, which emits blue light, are stacked one above the other. In this way, the front light 1' emits white light during operation. As an alternative, the front light can also contain an organic light-emitting component 2 which emits white light by means of a single functional layer sequence 23. Furthermore as an alternative a stack of three light-emitting components that emit red, green and blue light, for example, is also conceivable.

Furthermore as an alternative or in addition the bicycle has reflectors 10 in the spokes of the wheels, which reflectors in the present case contain luminaires in accordance with the exemplary embodiment in FIG. 3. The luminaires 10 contain for example a power supply device—not illustrated in FIG. 3—such as a battery or a rechargeable battery. Rear light 1 and/or front light 1' can likewise contain a battery or a rechargeable battery for power supply purposes and/or they can be supplied with operating current by means of an external power supply device such as a dynamo.

Figure 5:
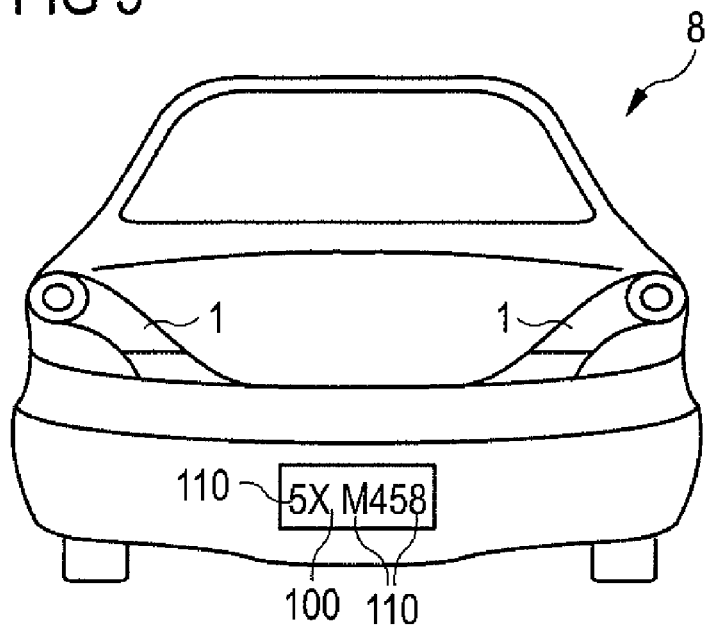
FIG. 5 shows a schematic rear view of a motor vehicle with a plurality of illumination devices.

FIG. 5 shows a schematic rear view of a car. Illumination devices 1 embodied for example analogously to the illumination device 1A of the luminaire 10 in accordance with FIG. 3 are used as rear lights of the motor vehicle.

In addition, a display panel, namely a license plate 100, is fitted to the motor vehicle, which likewise contains an illumination device in accordance with one of the previous exemplary embodiments, for example in accordance with the second exemplary embodiment. For representing the information contained on the number plate, in particular symbols 110 such as letters and/or numerals, for example the light passage area 7 is provided in places with an absorbent layer, for example with a color layer, which reduces or prevents the coupling-in of ambient light and the coupling-out of reflected light or light emitted by the organic light-emitting component in the region of the symbols 110.

Figure 6:
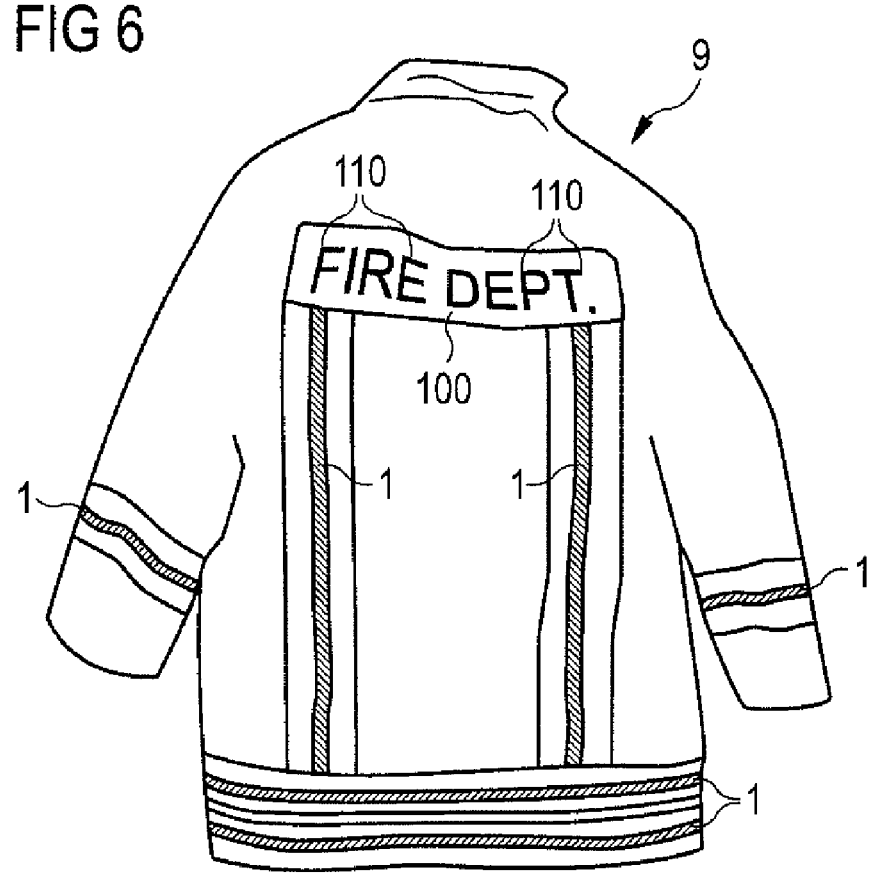
FIG. 6 shows a schematic illustration of a garment with a plurality of illumination devices.

The garment illustrated in FIG. 6 is provided with warning markings—in the form of strips in the present case—which are formed by illumination devices 1 or contain illumination devices 1. The illumination devices are embodied for example in accordance with one of the previous exemplary embodiments and are preferably embodied in flexible fashion.

The garment 9 in accordance with the exemplary embodiment in FIG. 6 is additionally provided with a display panel 100 embodied in flexible fashion and containing an illumination device 1 in accordance with one of the previous exemplary embodiments. A plurality of symbols 110 are represented—for example by means of an absorbent layer—on the display panel 100. By way of example, the symbols form a word or a plurality of words. In one preferred configuration, the garment 9 is provided with a power supply device, such as a battery, which supplies power to the illumination device(s) 1 and/or the display panel 100.

FIG. 7 illustrates an item of luggage 9, in the present case a school satchel, schematically in perspective view. Analogously to the garment in accordance with the exemplary embodiment in FIG. 6, the school satchel 9 is provided with warning markings which are embodied in the form of strips, for example, and which are formed by illumination devices 1 or contain illumination devices 1.

In addition, in the present case two fastening elements 10 of the item of luggage 9, for example clasps or locks, are embodied as a luminaire each containing an illumination device. The illumination device is embodied for example in accordance with the first exemplary embodiment or one of the variants of the first exemplary embodiment.

Power is supplied for example by means of at least one battery integrated into the item of luggage 9. By way of example, the fastening elements 10 can each contain a battery. In one configuration, the warning markings 1 are supplied with operating current by at least one further battery integrated into the item of luggage 9.

FIG. 8 shows a schematic cross section through an illumination device 1 in accordance with a fourth exemplary embodiment. The illuminating device 1 contains a plurality of light-emitting components, two light-emitting components 2A, 2B in the present case, which are laterally adjacent to one another. To put it another way, they are arranged alongside one another in a plan view of the light passage area 7. In the present case, the organic light-emitting components 2A, 2B are arranged on a common substrate 21.

In the present case, the components 2A and 2B are provided with different color filter layers 6A and 6B, respectively. In this way, the illumination device 1 produces a different color impression in the region of the first organic light-emitting component 2A from that in the region of the second organic light-emitting component 2B. By way of example, by means of the different color filter layers 6A, 6B, a pattern is formed, at least one symbol is represented and/or a graphical information item—for instance a drawing and/or a photograph—is reproduced.

FIG. 8 shows, in connection with the two organic light-emitting components 2A, 2B, two further exemplary examples of the arrangement of the color filter layer 6A and 6B, respectively. In the left-hand region, in the case of the first organic light-emitting component 2A, the color filter layer 6A is embodied in a manner integrated with the encapsulation 25A of the organic light-emitting component 2A. In the present case, a colorant is contained in the cap 25 which encapsulates the functional layer sequence 23A.

In the case of the second organic light-emitting component, the color filter layer 6B is embodied as an adhesion promoting layer. The adhesion promoting layer, for example an adhesive layer, connects the cap 25B to the second electrode 24B substantially over the whole area.

It is also conceivable for at least one of the organic light-emitting components 2A, 2B to have no color filter layer 6A, 6B, for example as in the illumination device in FIG. 2.

Figure 9:
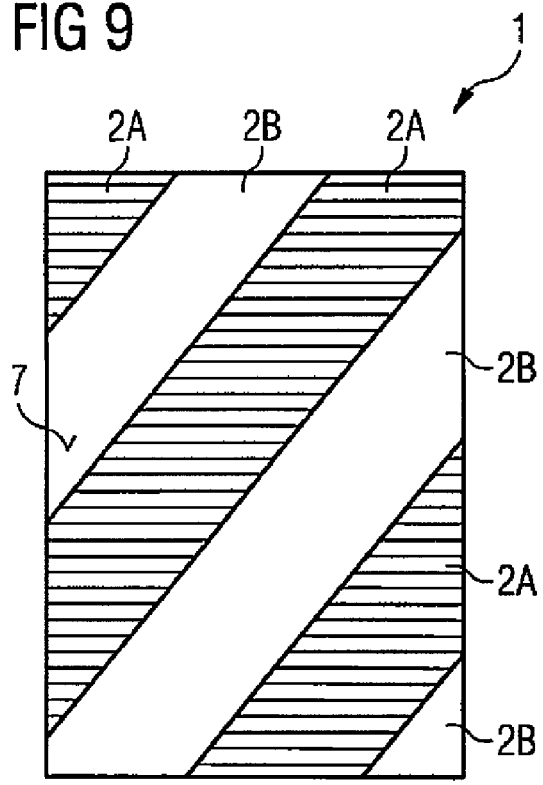
FIG. 9 shows a schematic plan view of a warning marking with an illumination device in accordance with the third exemplary embodiment.

FIG. 9 shows an illumination device 1 in schematic plan view. In the illumination device 1, first organic light-emitting components 2A and second organic light-emitting components 2B or stacks of organic light-emitting components form a pattern. The pattern is in the form of strips, for example, in a plan view of the light passage area 7.

The first organic light-emitting components 2A have a color filter layer 6A, for example, which contains a red colorant, for example. The second organic light-emitting components 2B or stacks of components are provided, in one configuration, for emitting white light and in the present case are not covered by a color filter layer 6.

As an alternative, the pattern can be formed by an organic light-emitting component 2, which emits white light, for example, being provided with the colorant layer 6 in places.

Figure 10:
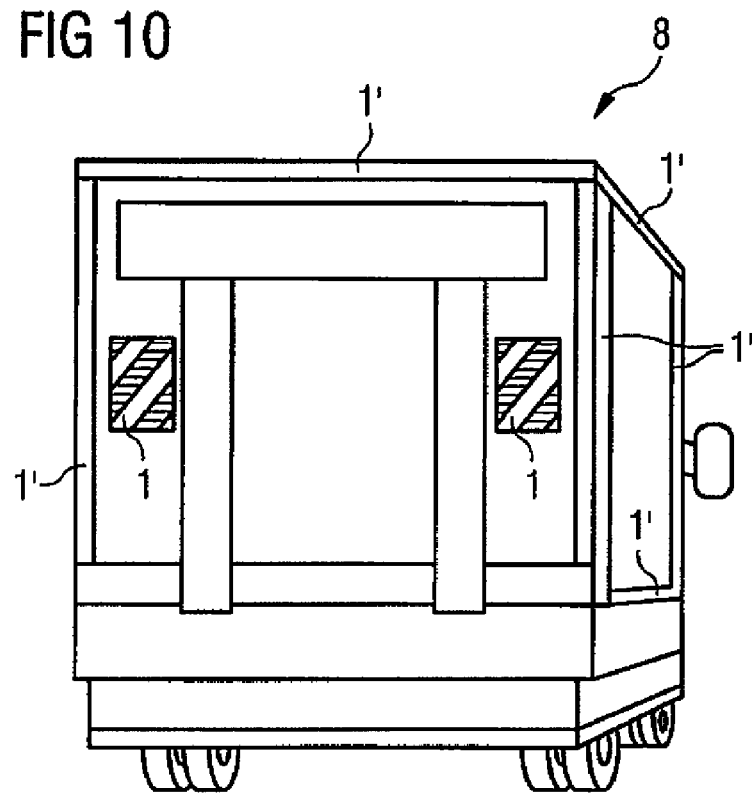
FIG. 10 shows a schematic perspective view of a truck with a plurality of illumination devices.

FIG. 10 shows a schematic perspective view of a truck provided with two illumination devices 1 in accordance with the exemplary embodiment in FIG. 9. In the present exemplary embodiment, the illumination devices 1 constitute warning markings, for example warning markings for an elevating loading platform.

In addition, the truck in the present exemplary embodiment is provided with illumination devices 1' which run for example along the edges of the loading space of the lorry. These illumination devices 1' constitute contour markings.

FIG. 11 shows a display panel 100 in a schematic plan view of the light passage area 7 of the illumination device 1. By way of example, a pictogram is represented as information on the display panel 100. For representing the information, the organic light-emitting component 2, which in the present case illuminates substantially the entire light passage area 7 of the illumination device 1, is covered in places by a color filter layer 6.

FIG. 12 shows a second exemplary embodiment of a display panel 100. The display panel in accordance with FIG. 12 is a road sign. The light passage area is covered in places with an absorbent layer having the form of symbols 110, the numerals 8 and 0 in the present case. The organic light-emitting component 2, which emits white light, for example, is covered by a color filter layer 6 in an edge region in the present case in a plan view of the light passage area 7.

In the present case, the color filter layer 6 runs annularly around the symbols 110. The illumination device has a circular basic area. Thus, by means of the shape of the color filter layer 6 and the illumination device 1, a further item of information is represented, namely that the road sign 100 in the present case is a prohibition sign.

Figure 13:
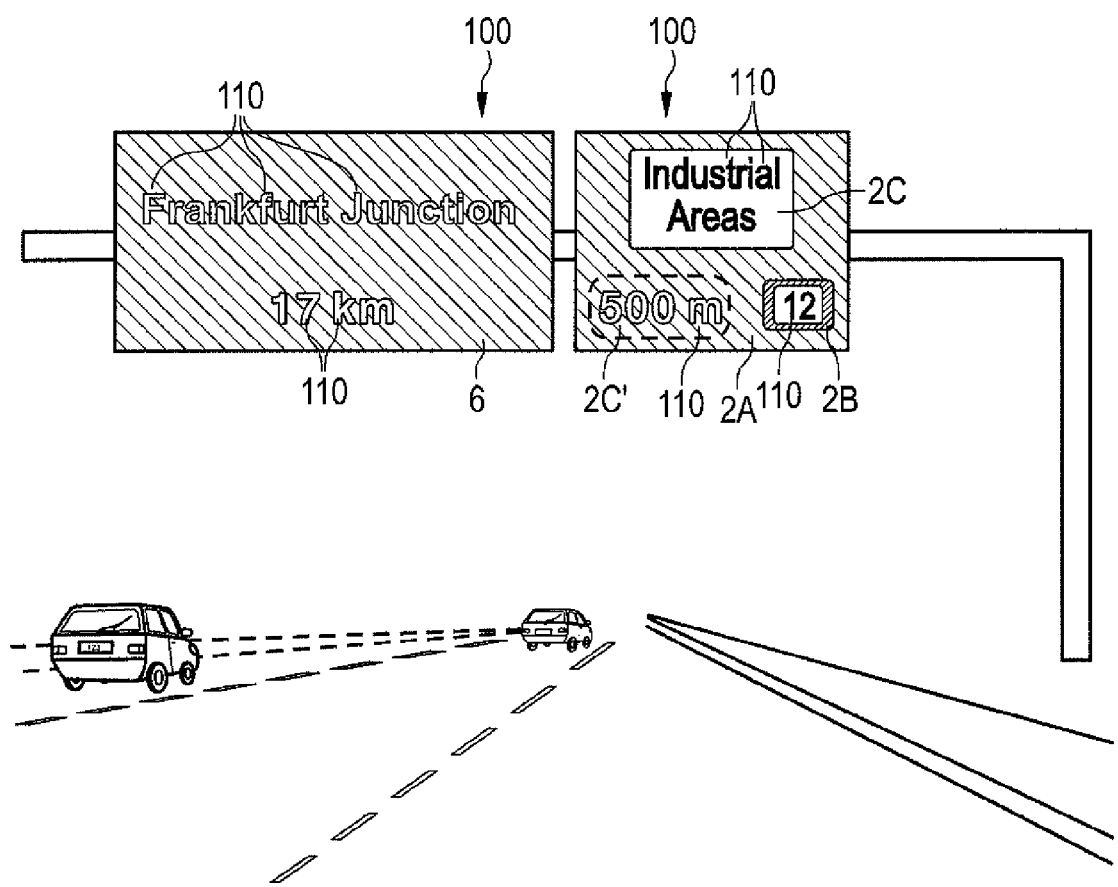
FIG. 13 shows a schematic illustration of a display device in accordance with a third exemplary embodiment.

FIG. 13 schematically illustrates two display panels 100 in a third exemplary embodiment in a plan view of the light passage area 7. The display panels 100 illustrated are direction indicating signs, for example for traffic.

The left-hand direction indicating sign 100 shows by way of example a configuration in which symbols 110 are represented by means of cut-outs in a color filter layer 6. By way of example, the color filter layer 6 is adhesively bonded onto an organic light-emitting component, in particular on to the encapsulation 25 thereof and/or onto the substrate 21 thereof.

The display panel 100 illustrated by way of example on the right has a plurality of organic light-emitting components 2A, 2B, 2C and 2C' that are laterally adjacent to one another. By way of example, the second organic light-emitting component 2B and/or the third organic light-emitting components 2C, 2C' are arranged in openings in the first organic light-emitting component 2A. In particular, the organic light-emitting components 2A, 2B, 2C, 2C', form a substantially continuous luminous area. They differ for example in the color impression in the light respectively coupled out.

Symbols 110 are represented on the second and third organic light-emitting components 2B, 2C, 2C'. By way of example, the symbols are represented by means of an absorbent layer, for instance in the case of the organic light-emitting components 2B and 2C, or by means of a color filter layer applied in places for instance in the case of the component 2C'.

The invention is not restricted to the exemplary embodiments by the description on the basis of said exemplary embodiments. Rather, it encompasses any new feature and also a combination of features, even if this feature or this combination is not explicitly specified in the exemplary embodiments and/or patent claims.

I claim:

1. An illumination device comprising:
an organic light-emitting component containing a functional layer sequence for generating light;
a light passage area for coupling out light emitted by the organic light-emitting component from the illumination device and for coupling ambient light into the illumination device;
a wavelength-selective retroreflector for reflecting at least part of the ambient light coupled in through the light passage area back to the light passage area,
wherein the organic light-emitting component is embodied such that it is at least partly light-transmissive,
wherein the functional layer sequence is arranged between the light passage area and the retroreflector.

2. The illumination device according to claim 1, wherein ambient light that impinges on the light passage area at an entrance angle, is coupled into the illumination device and reflected back to the light passage area by the retroreflector is coupled out from the illumination device at an exit angle with respect to the light passage area, said exit angle having substantially the same value as the entrance angle.

3. The illumination device according to claim 1, comprising a color filter layer, which is arranged at least in places between the light passage area and the functional layer sequence.

4. The illumination device according to claim 1, comprising a plurality of organic light-emitting components arranged laterally alongside one another.

5. The illumination device according to claim 4, wherein different color filters are assigned to at least two organic light-emitting components arranged laterally alongside one another.

6. The illumination device according to claim 1, comprising a plurality of organic light-emitting components whose functional layer sequences overlap laterally.

7. The illumination device according to claim 1, wherein the retroreflector has a mirror layer having a plurality of beam shaping elements, wherein at least one beam shaping element includes or consists of a depression in the surface of the mirror layer and/or at least one beam shaping element has or consists of a lens element.

8. The illumination device according to claim 1, wherein:
the retroreflector has a mirror layer having a plurality of beam shaping elements,
at least one beam shaping element has a depression in the surface of the mirror layer and a lens element, and
the lens element is partly arranged in the depression and projects beyond the depression in a direction of the light passage area.

9. The illumination device according to claim 1, wherein the retroreflector has a plurality of beam shaping elements which are arranged in an at least partly light-transmissive carrier layer and are embodied in reflective fashion in places.

10. The illumination device according to claim 1, which is embodied in flexible fashion.

11. The illumination device according to claim 1, which is a warning marking or a reflector.

12. A luminaire for a means of transport comprising an illumination device according to claim 1.

13. A display device comprising an illumination device according to claim 1.

14. A garment or item of luggage provided with an illumination device according to claim 1.

15. A garment or item of luggage provided with a display device according to claim 13.

16. The illumination device according to claim 1, wherein the wavelength selective retroreflector is a wavelength-selective mirror layer.

17. The illumination device according to claim 1, wherein the wavelength selective retroreflector is a color filter layer, the color filter layer being arranged between the organic light-emitting component and a side of the illumination device remote from the light passage area.

18. An illumination device comprising:
a plurality of organic light-emitting components, each containing a functional layer sequence for generating light;
a light passage area for coupling out light emitted by the organic light-emitting components from the illumination device and for coupling ambient light into the illumination device;
a retroreflector for reflecting at least part of the ambient light coupled in through the light passage area back to the light passage area, wherein the organic light-emitting components are embodied such that they are at least partly light-transmissive;
wherein the functional layer sequences of the plurality of organic light-emitting components overlap laterally and the functional layer sequences are arranged between the light passage area and the retroreflector.

* * * * *

UNITED STATES PATENT AND TRADEMARK OFFICE
CERTIFICATE OF CORRECTION

PATENT NO. : 7,922,358 B2  
APPLICATION NO. : 12/240392  
DATED : April 12, 2011  
INVENTOR(S) : Norwin von Malm Page 1 of 1

It is certified that error appears in the above-identified patent and that said Letters Patent is hereby corrected as shown below:

On the Title Page, insert in Item (56) References Cited

U.S. PATENT DOCUMENTS

--6,898,018   Minoura et al.--

Signed and Sealed this
Twenty-seventh Day of August, 2013

Teresa Stanek Rea
*Acting Director of the United States Patent and Trademark Office*